United States Patent
Inaba et al.

(10) Patent No.: US 10,446,739 B2
(45) Date of Patent: Oct. 15, 2019

(54) SEMICONDUCTOR MEMORY DEVICE

(71) Applicant: TOSHIBA MEMORY CORPORATION, Minato-ku, Tokyo (JP)

(72) Inventors: Tsuneo Inaba, Kamakura Kanagawa (JP); Tatsuya Kishi, Seongnam-si (KR); Masahiko Nakayama, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 101 days.

(21) Appl. No.: 15/702,339

(22) Filed: Sep. 12, 2017

(65) Prior Publication Data

US 2018/0277743 A1 Sep. 27, 2018

(30) Foreign Application Priority Data

Mar. 24, 2017 (JP) .................. 2017-059262

(51) Int. Cl.
| | |
|---|---|
| *H01L 43/02* | (2006.01) |
| *G11C 11/16* | (2006.01) |
| *G11C 7/10* | (2006.01) |
| *H01L 43/10* | (2006.01) |
| *H01L 43/12* | (2006.01) |
| *H01L 43/08* | (2006.01) |

(52) U.S. Cl.
CPC ............ *H01L 43/02* (2013.01); *G11C 7/1096* (2013.01); *G11C 11/1675* (2013.01); *G11C 11/1697* (2013.01); *H01L 43/08* (2013.01); *H01L 43/10* (2013.01); *H01L 43/12* (2013.01)

(58) Field of Classification Search
CPC ..... H01L 43/08; H01L 27/222; H01L 27/224; H01L 29/66984
See application file for complete search history.

(56) References Cited

U.S. PATENT DOCUMENTS

| | | | |
|---|---|---|---|
| 8,331,141 B2 * | 12/2012 | Shukh | ..................... H01L 43/08 365/148 |
| 8,867,266 B2 | 10/2014 | Bessho et al. | |
| 9,058,885 B2 | 6/2015 | Luo et al. | |
| 9,263,189 B2 * | 2/2016 | Shukh | .................... H01G 4/008 |

(Continued)

FOREIGN PATENT DOCUMENTS

| | | |
|---|---|---|
| JP | 2008524830 A | 7/2008 |
| JP | 2012022726 A | 2/2012 |
| JP | 2012248240 A | 12/2012 |

*Primary Examiner* — Zandra V Smith
*Assistant Examiner* — John M Parker
(74) *Attorney, Agent, or Firm* — Holtz, Holtz & Volek PC

(57) ABSTRACT

According to one embodiment, a semiconductor memory device includes the following configuration. A resistance change element has first, second and third magnetic layers and a non-magnetic layer disposed between the first and second magnetic layers, and a metal layer disposed between the second and third magnetic layers. An SAF structure is comprised of the second magnetic layer, the metal layer and the third magnetic layer. A write circuit applies a first voltage and a second voltage having reversed polarity of the first voltage to the resistance change element in a write operation in which the resistance change element is changed from a low-resistance state to a high-resistance state.

20 Claims, 10 Drawing Sheets

(56) References Cited

U.S. PATENT DOCUMENTS

| | | | |
|---|---|---|---|
| 2004/0012995 A1* | 1/2004 | Ishikawa | G11C 11/15 365/158 |
| 2004/0017712 A1* | 1/2004 | Hoffmann | G11C 11/16 365/202 |
| 2004/0160805 A1* | 8/2004 | Rinerson | G11C 11/5678 365/158 |
| 2005/0041462 A1 | 2/2005 | Kent et al. | |
| 2008/0094886 A1* | 4/2008 | Ranjan | B82Y 10/00 365/171 |
| 2008/0112087 A1* | 5/2008 | Clinton | G11B 5/02 360/317 |
| 2012/0155159 A1 | 6/2012 | Prejbeanu | |
| 2013/0148418 A1* | 6/2013 | Luo | G11C 11/1675 365/158 |
| 2014/0042571 A1* | 2/2014 | Gan | H01L 43/02 257/421 |
| 2015/0255135 A1 | 9/2015 | Tran et al. | |

* cited by examiner

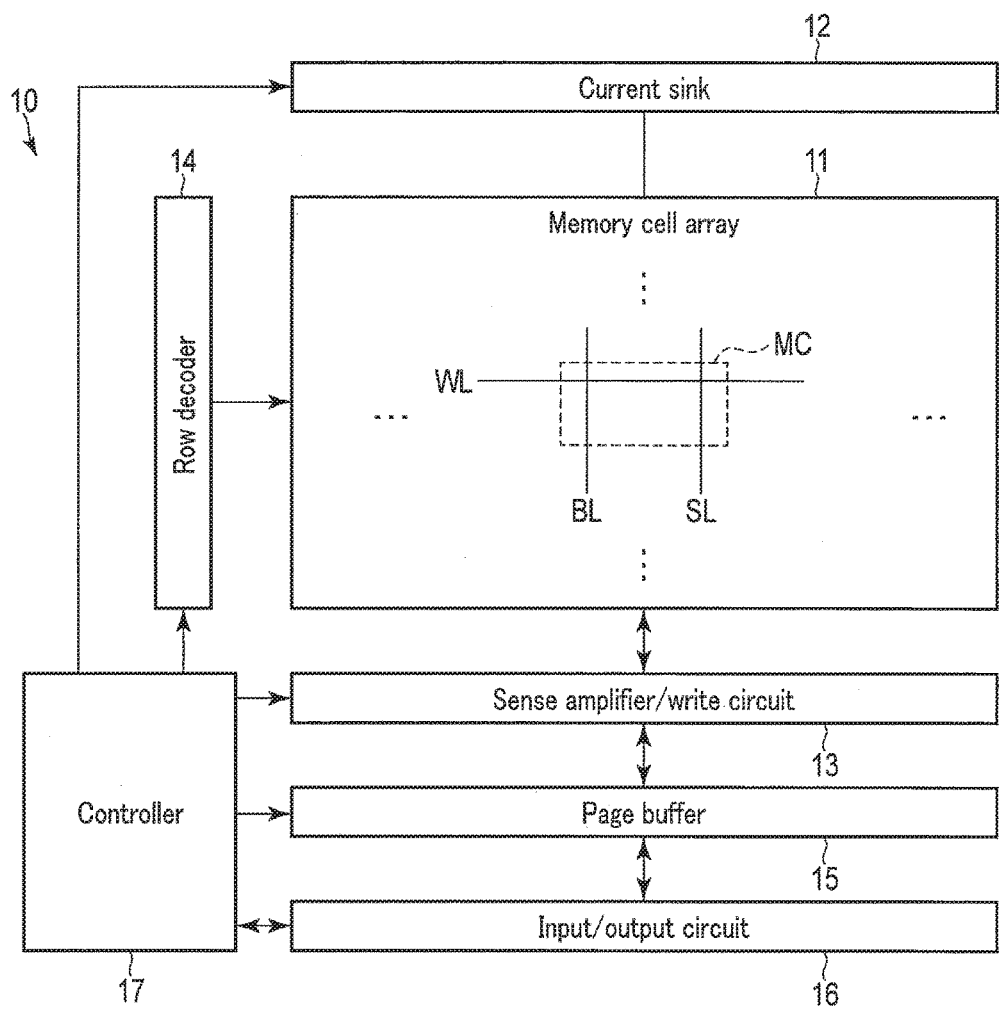
F I G. 1

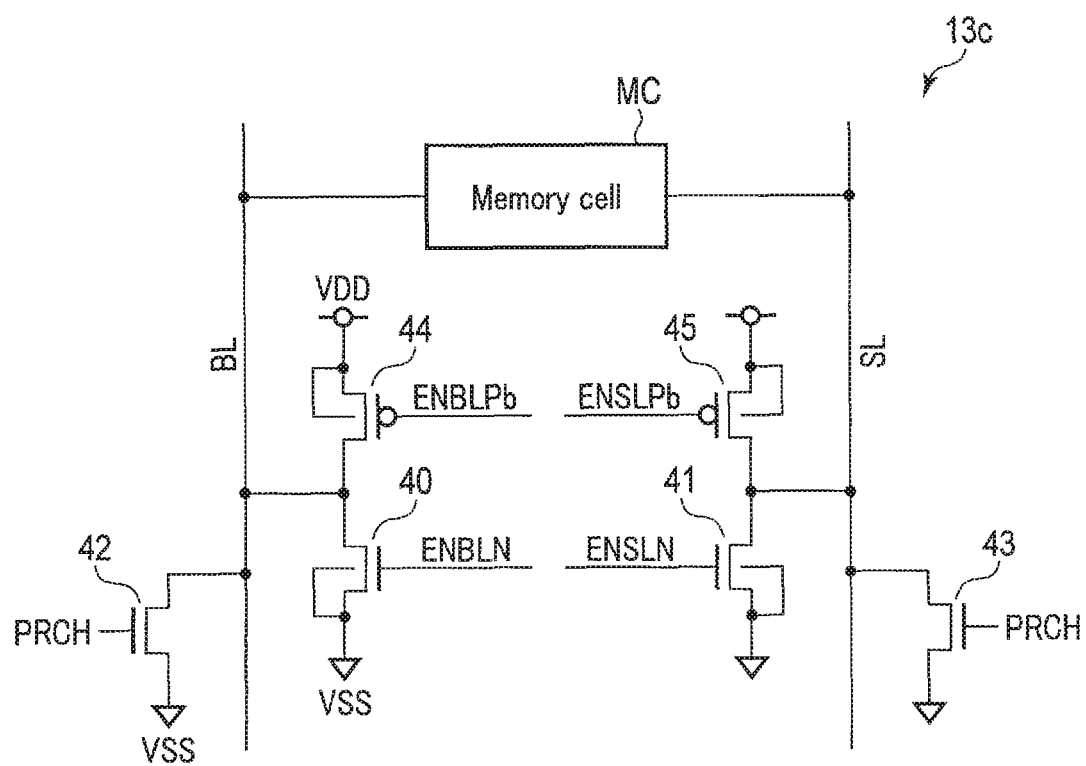
F I G. 6

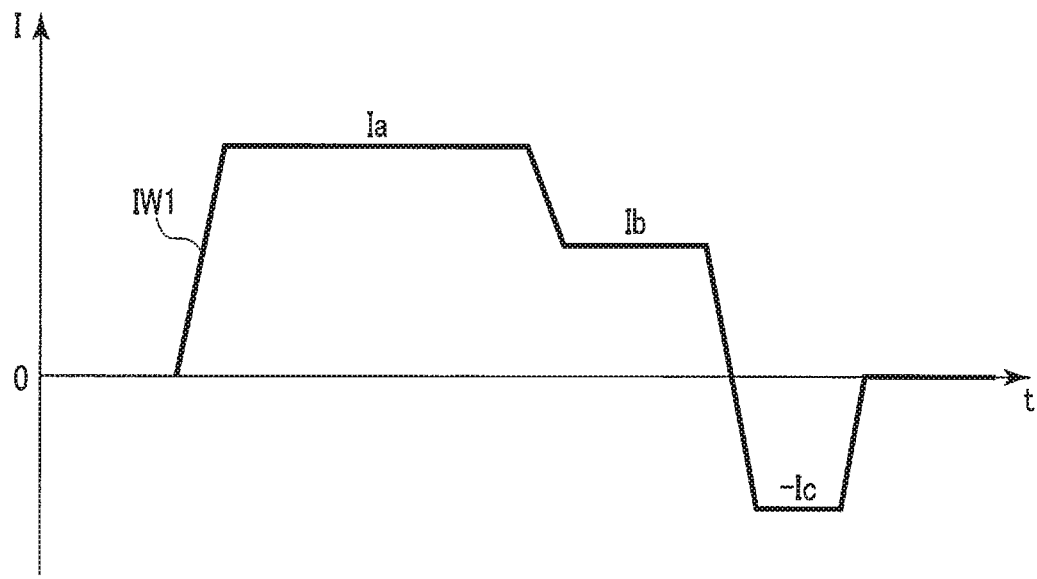
F I G. 8
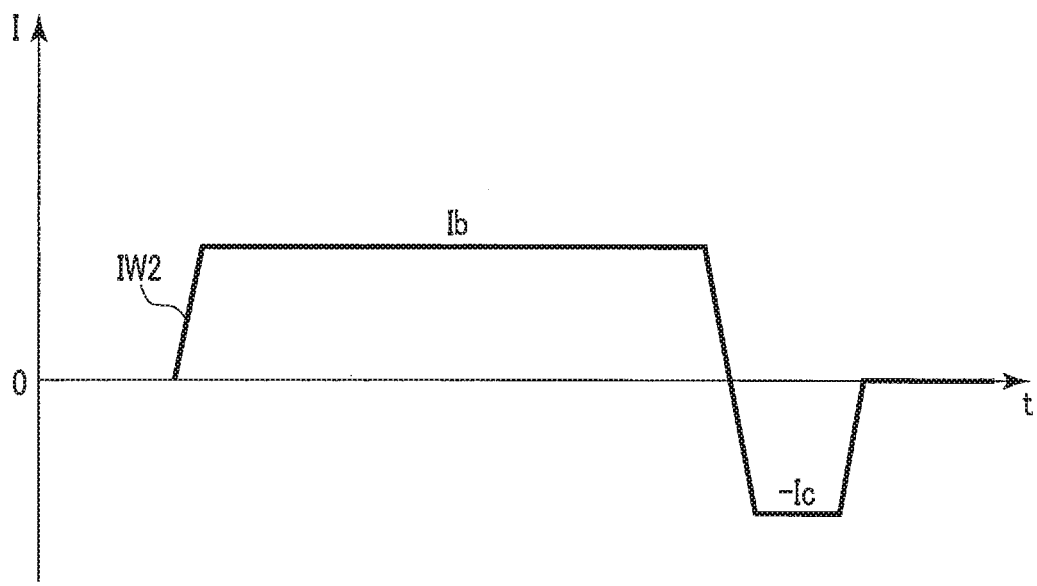
F I G. 9

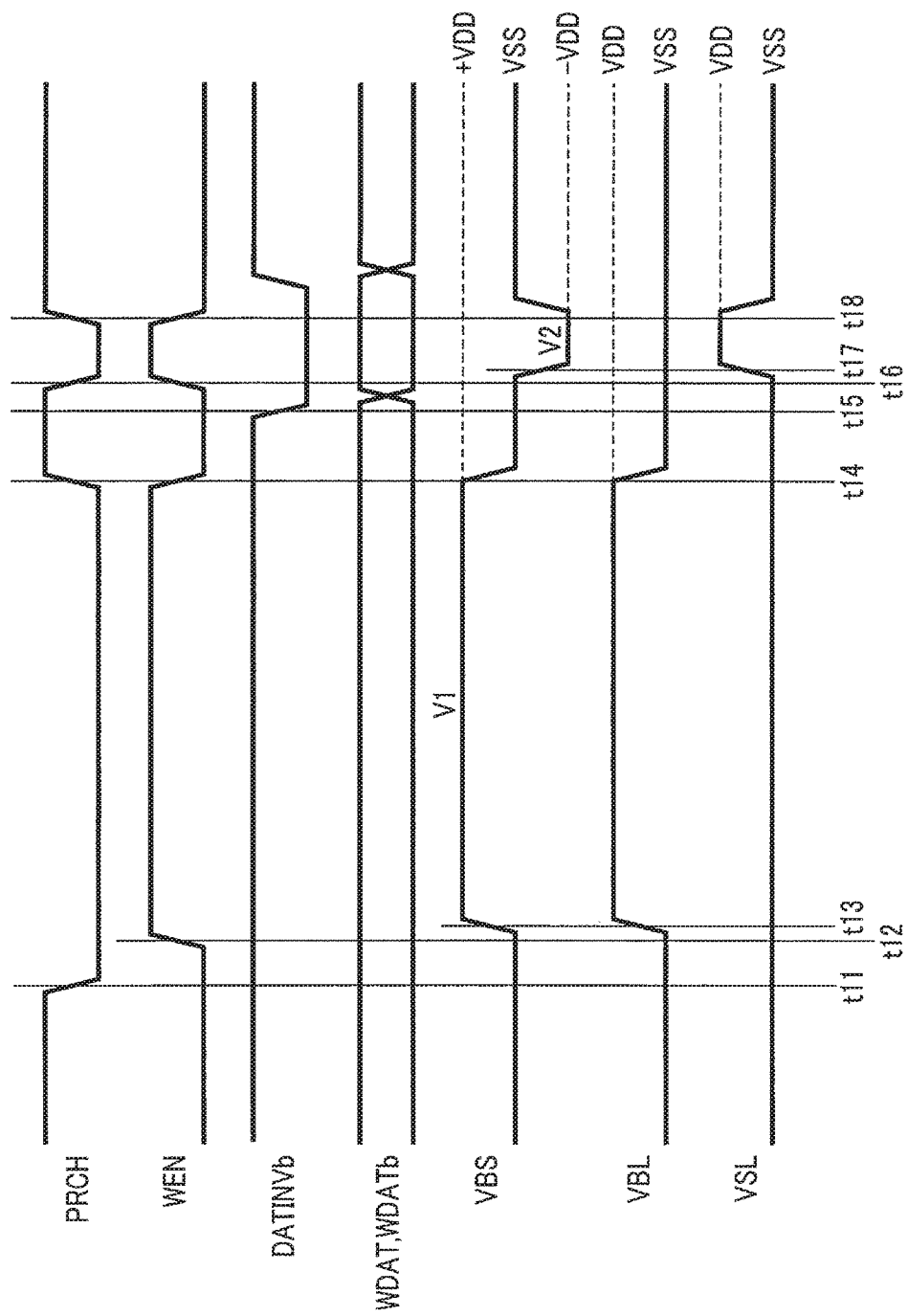
F I G. 12

US 10,446,739 B2

SEMICONDUCTOR MEMORY DEVICE

CROSS-REFERENCE TO RELATED APPLICATIONS

This application is based upon and claims the benefit of priority from the Japanese Patent Application No. 2017-059262, filed Mar. 24, 2017, the entire contents of which are incorporated herein by reference.

FIELD

Embodiments described herein relate generally to a semiconductor memory device.

BACKGROUND

A magnetoresistive random access memory (MRAM) using a magnetoresistive effect in a memory cell is known as a semiconductor memory device. An MRAM is receiving attention as a memory device characterized by its high-speed operation, large storage capacity, and non-volatility.

BRIEF DESCRIPTION OF THE DRAWING

FIG. 1 is a block diagram showing a configuration of the semiconductor memory device according to the present embodiment.

FIG. 6 is a circuit diagram of a write driver in the semiconductor memory device.

FIGS. 8 and 9 are diagrams showing a write current flowing in a memory cell during the "1" data write operation.

FIG. 12 is a timing chart illustrating a "1" data write operation in a first modification.

DETAILED DESCRIPTION

Figure 2:
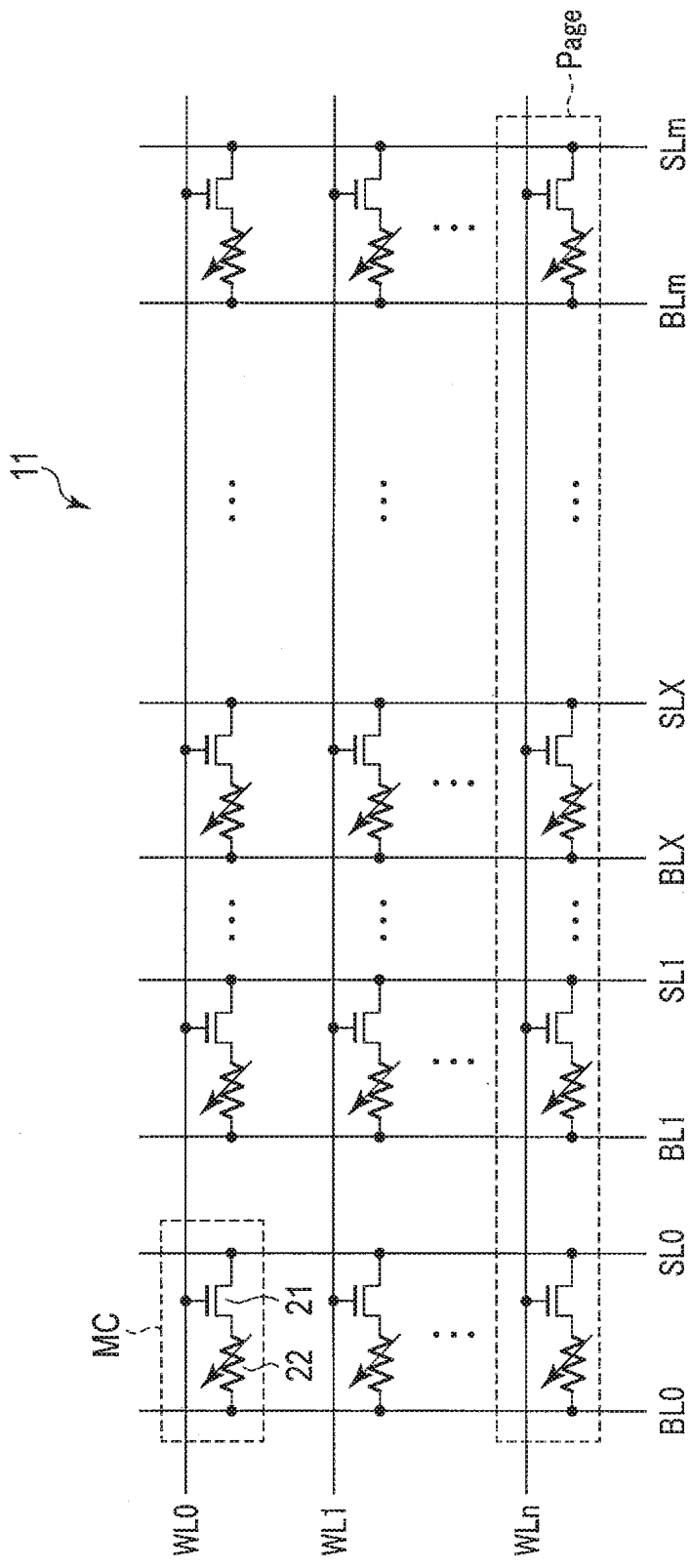
FIG. 2 is a circuit diagram of a memory cell array in the semiconductor memory device.

In general, according to one embodiment a semiconductor memory device includes a resistance change element and a write circuit. The resistance change element has a first magnetic layer, a second magnetic layer, a third magnetic layer, a non-magnetic layer disposed between the first magnetic layer and the second magnetic layer, and a metal layer disposed between the second magnetic layer and the third magnetic layer. The write circuit is configured to apply a voltage to the resistance change element. A synthetic antiferromagnetic (SAF) structure is comprised of the second magnetic layer, the metal layer, and the third magnetic layer. The write circuit applies a first voltage and a second voltage having reversed polarity of the first voltage to the resistance change element in a write operation in which the resistance change element is changed from a first resistance value to a second resistance value which is greater than the first resistance value.

Hereinafter, embodiments will be described with reference to the drawings. In the explanation below, constituent elements having the same functions and configurations will be denoted by the same reference symbols. Each of the following embodiments is shown to present an example of a device and a method for carrying out the technical concept of the embodiment, and it is to be understood that the materials, the shapes, the structures, the arrangements, and the like of the constituent components are not limited to those shown below.

Each of the function blocks can be implemented in the form of hardware, computer software, or a combination thereof. The function blocks do not have to be categorized as in the example described below. For example, part of the functions may be implemented by a function block other than the exemplary function blocks. In addition, the exemplary function blocks may be further divided into function sub-blocks.

Embodiment

A semiconductor memory device according to the present embodiment will be described.

[1] Configuration of Semiconductor Memory Device

The semiconductor memory device of the present embodiment will be described as a perpendicular magnetization type MRAM, using a magnetoresistive effect (magnetic tunnel junction; MTJ) element as a resistive storage element (or a variable resistance element). Hereinafter, a resistive storage element may be called as a resistance change element.

FIG. 1 is a block diagram showing a configuration of the semiconductor memory device according to the present embodiment. As shown in FIG. 1, the semiconductor memory device 10 includes a memory cell array 11, a current sink 12, a sense amplifier and write circuit 13, a row decoder 14, a page buffer 15, an input/output circuit 16, and a controller 17.

The memory cell array 11 includes a plurality of memory cells MC arranged in rows and columns. Memory cells MC arranged in the same row are coupled to the same word line WL, and both ends of memory cells MC arranged in the same column are coupled to the same bit line BL and the same source line SL.

The current sink 12 is coupled to the bit lines BL and the source lines SL. In an operation, such as data write and read operations, the current sink 12 sets the bit lines BL or the source lines SL to a reference voltage VSS, e.g., a ground potential.

The sense amplifier and write circuit 13 is coupled to the bit lines BL and the source lines SL. The sense amplifier and write circuit 13 supplies a current to a memory cell MC, which is an operation target, via the bit line BL and the source line SL to write data to the memory cell MC. The sense amplifier and write circuit 13 supplies a current to a memory cell MC, which is an operation target, via the bit line BL and the source line SL to read data from the memory cell MC. More specifically, the sense amplifier and write circuit 13 has a driver control circuit and a write driver. The driver control circuit and the write driver of the sense amplifier and write circuit 13 write data to a memory cell MC. The sense amplifier of the sense amplifier and write circuit 13 reads data from a memory cell MC. The details of a data write operation by the driver control circuit and the write driver will be described later.

The row decoder 14 is coupled to the memory cell array 11 via the word lines WL. The row decoder 14 decodes a row address that designates a row direction of the memory cell array 11. A word line WL is then selected in accordance with the result of decoding, and a voltage necessary for an operation, such as data write and data read is applied to the selected word line WL.

The page buffer 15 temporarily stores data to be written to the memory cell array 11 and data read from the memory cell array 11 in a unit of data, called "page".

The input/output circuit 16 sends various signals received from the outside of the semiconductor memory device 10 to the controller 17 and the page buffer 15, and sends various information from the controller 17 and the page buffer 15 to the outside of the semiconductor memory device 10.

The controller 17 is coupled to each of the current sink 12, the sense amplifier and write circuit 13, the row decoder 14, the page buffer 15, and the input/output circuit 16. The controller 17 controls the current sink 12, the sense amplifier and write circuit 13, the row decoder 14, and the page buffer 15 in accordance with the various signals received by the input/output circuit 16 from the outside of the semiconductor memory device 10.

[1-1] Memory Cell Array

Next, the configuration of the memory cell array 11 of the semiconductor memory device 10 will be described. FIG. 2 is a circuit diagram illustrating the configuration of the memory cell array 11.

A plurality of memory cells MC are arranged in a matrix in the memory cell array 11 as described above. In the memory cell array 11, a plurality of word lines WL (WL0 to WLn), a plurality of bit lines BL (BL0 to BLm), and a plurality of source lines SL (SL0 to SLm) are arranged. The symbols n and m are integers not less than 0.

The word lines WL extend in the row direction, and the bit lines BL and the source lines SL extend in the column direction. A bit line BL and a source line SL adjacent to each other constitute a pair. The word lines WL and pairs of the bit lines BL and the source lines SL are thus arranged to cross each other. The memory cells MC are provided at intersections of the word lines WL and pairs of the bit lines BL and the source lines SL. The memory cells MC of one row are coupled to one word line WL, and the memory cells MC of one column are coupled to one pair of one bit line BL and one source line SL. A pair of one word line WL and the memory cells MC coupled thereto is called "page".

[1-1-1] Memory Cell

Figure 3:
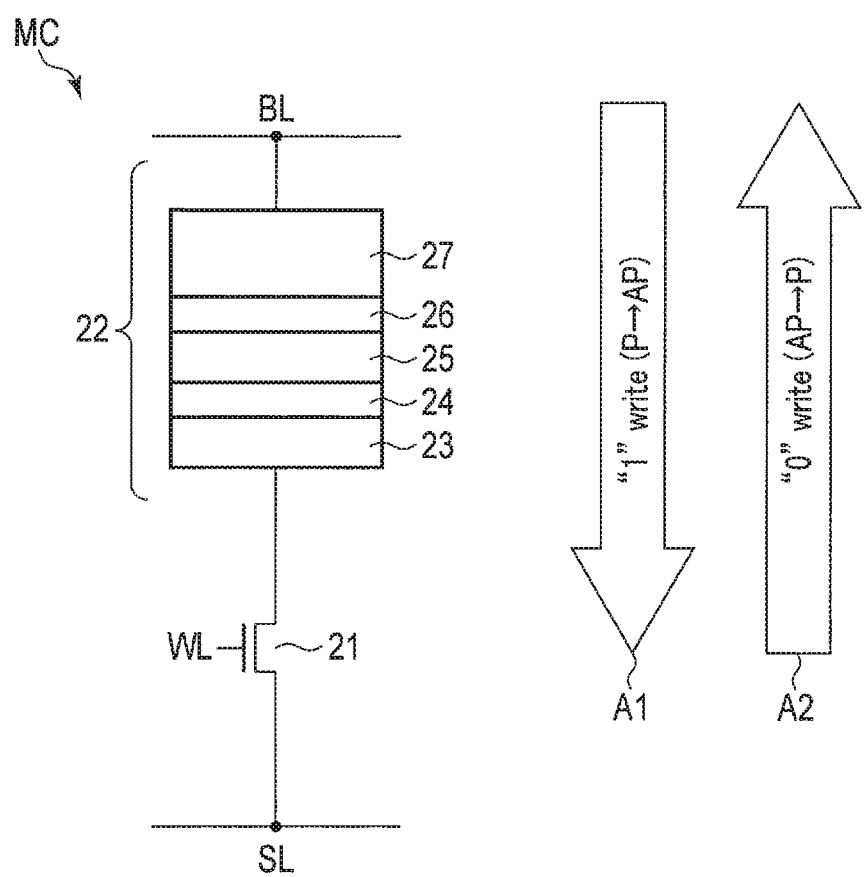
FIG. 3 is a schematic diagram illustrating a configuration of a memory cell in the memory cell array.

Next, the configuration of the memory cells MC in the memory cell array 11 will be described. FIG. 3 is a schematic diagram showing the configuration of a memory cell MC.

As shown in FIG. 3, a memory cell MC includes a selection transistor 21 and a magnetoresistive effect element 22, for example. The selection transistor 21 is provided as a switch for controlling supplying and stopping a current at the time of writing data to and reading data from the magnetoresistive effect element 22. The magnetoresistive effect element 22 includes a plurality of films that are three-dimensionally laminated. By applying a current to the film surfaces of the plurality of films in a perpendicular direction, a resistance value of the magnetoresistive effect element 22 is switched between a low resistance state and a high resistance state. The magnetoresistive effect element 22 is capable of writing data in accordance with the change of the resistance state, and stores written data in a non-volatile manner to function as a readable resistive memory element.

The gate of the selection transistor 21 is coupled to a word line WL, either the source or the drain of the selection transistor 21 is coupled to a source line SL, and the other is coupled to one end of the magnetoresistive effect element 22. The other end of the magnetoresistive effect element 22 is coupled to a bit line BL.

[1-1-2] Magnetoresistive Effect Element

Subsequently, a configuration example of the magnetoresistive effect element 22 in the memory cell MC will be explained with reference to FIG. 3. The magnetoresistive effect element 22 of the present configuration example includes a storage layer 23, an intermediate layer 24, a reference layer 25, a coupling layer 26, and a shift adjustment layer 27. The magnetoresistive effect element 22 may include more layers. The intermediate layer 24 is arranged between the storage layer 23 and the reference layer 25. The coupling layer 26 is arranged between the reference layer 25 and the shift adjustment layer 27. The storage layer 23, the intermediate layer 24, the reference layer 25, the coupling layer 26, and the shift adjustment layer 27 are three-dimensionally laminated from the bottom in this order on their film surfaces. The magnetoresistive effect element 22 is a perpendicular magnetization type MTJ element in which the magnetization direction of each of the storage layer 23 and the reference layer 25 is perpendicular to the film surface.

The storage layer 23 includes one or more electrically-conductive magnetic materials, or consists of an electrically-conductive magnetic material. More specifically, the storage layer 23 includes one or more elements, such as iron (Fe), boron (B), and cobalt (Co), and includes cobalt iron boron (CoFeB) or iron boroid (FeB), for example. The storage layer 23 may include an artificial lattice. Or, the storage layer 23 includes or consists of an alloy of Co, Fe, and B.

The storage layer 23 is magnetized in a direction along an axis, and the magnetization of the storage layer 23 is stable along an axis penetrating the layers 23, 24, and 25, for example, in a direction perpendicular to the interface surfaces between the layers 23, 24, and 25. In other words, the storage layer 23, for example, has magnetic anisotropy along an axis penetrating the layers 23, 24, and 25, for example, a direction perpendicular to the interface surfaces of, for example, the layers 23, 24, and 25, and has so-called perpendicular magnetic anisotropy. The magnetization of the storage layer 23 can be stabilized in either one of the two directions along the axis of easy magnetization. The magnetization direction of the storage layer 23 can be reversed by a current (a write current) flowing through the layers 23, 24, and 25.

The intermediate layer 24 includes or consists of a non-magnetic insulating material, and functions as a tunnel barrier. The intermediate layer 24 includes or consists of magnesium oxide (MgO), for example.

The reference layer 25 includes or consists of an electrically-conductive magnetic material. The reference layer 25 includes at least one of Co, Pt, Pd, and Ni. The reference layer 25 includes or consists of, for example, cobalt platinum (CoPt), cobalt nickel (CoNi) or cobalt palladium (CoPd). The reference layer 25 may be made of the same material as the storage layer 23.

The reference layer 25 has perpendicular magnetic anisotropy, like the storage layer 23. The reference layer 25 has magnetization in a fixed or invariant direction, and has, for example, a coercivity larger than that of the storage layer 23. A "fixed" or "invariant" magnetization direction of the reference layer 25 means that the magnetization direction of the reference layer 25 is difficult to be reversed by a write current of a level that is capable of reversing the magnetization of the storage layer 23. The present embodiment deals with a case where the magnetization direction of the reference layer 25 is reversed by a write current.

A combination of the storage layer 23, the intermediate layer 24, and the reference layer 25 produces a magnetoresistive effect. More specifically, if the magnetization direction of the storage layer 23 and the magnetization direction of the reference layer 25 are parallel and antiparallel, the magnetoresistive effect element 22 has minimum and maximum resistance values. A high resistance or a low resistance of the magnetoresistive effect element 22, i.e., a magnetization direction of the storage layer 23, can be used for data storage by, for example, a cell of a storage device.

The shift adjustment layer 27 has a function of suppressing a magnetic field generated by the reference layer 25 and applied to the storage layer 23 (i.e., a leakage magnetic field) The shift adjustment layer 27 includes or consists of an electrically-conductive magnetic material. The shift adjustment layer 27 may be made of the same or substantially the same material as the reference layer 25, for example.

The reference layer 25 generates a magnetic field that penetrates the intermediate layer 24 and reaches the inside of the storage layer 23. Because of this magnetic field, the magnetization of the storage layer 23 is prone to be directed in a direction that aligns with the magnetic field. The shift adjustment layer 27 is intended to suppress or balance the leakage magnetic field generated by the reference layer 25, using a magnetic field generated by the shift adjustment layer 27. More specifically, the magnetic field generated in the storage layer 23 by the reference layer 25 is suppressed or balanced by a magnetic field that is generated by the shift adjustment layer 27 and has magnetic lines of force in a direction opposite to the magnetic lines of force of the magnetic field that reaches the inside of the storage layer 23 and is generated by the reference layer 25.

The shift adjustment layer 27 is more distant from the reference storage layer 23 than the reference layer 25 is, and the magnetic field generated in the storage layer 23 by the shift adjustment layer 27 is thus smaller than the magnetic field generated in the storage layer 23 by the reference layer 25. For this reason, in order to generate, from a position more distant from the storage layer 23 than the reference layer 25 is, a magnetic field in the storage layer 23 as large as the magnetic field generated in the storage layer 23 by the reference layer 25, the shift adjustment layer 27 has an amount of magnetization greater than the amount of magnetization the reference layer 25. More specifically, for example, the shift adjustment layer 27 is made of the same or substantially the same material as the reference layer 25, and is thicker than the reference layer 25.

The coupling layer 26 includes or consists of an electrically-conductive material. The coupling layer 26 has a function of making an antiferromagnetic coupling between the reference layer 25 and the shift adjustment layer 27. In other words, the reference layer 25, the coupling layer 26, and the shift adjustment layer 27 constitute a synthetic antiferromagnetic (SAF) structure. The coupling layer 26 includes or consists of Ru, Rh, or Os, for example. It is known that Ru couples two magnetic materials between which a Ru layer is interposed by a magnetic coupling or an antiferromagnetic coupling in accordance with the thickness of Ru. The coupling layer 26 may further include a layer of Pt and/or Pd. The coupling layer 26 has a thickness capable of making an antiferromagnetic coupling between the reference layer 25 and the shift adjustment layer 27.

The present embodiment adopts a spin transfer torque writing method in which a write current is supplied to such a magnetoresistive effect element 22 and a magnetization direction of the storage layer 23 is controlled with the write current. The magnetoresistive effect element 22 can take one of a low-resistance state and a high-resistance state, depending on whether the magnetization directions of the storage layer 23 and the reference layer 25 are parallel or antiparallel.

If a write current flowing in the direction indicated by arrow A1 in FIG. 3, i.e., from the reference layer 25 to the storage layer 23, is supplied with the magnetoresistive effect element 22, the relationship between the magnetization directions of the storage layer 23 and the reference layer 25 becomes antiparallel. In this antiparallel state, the resistance value of the magnetoresistive effect element 22 becomes greater, and the magnetoresistive effect element 22 is set to a high-resistance state. This high-resistance state is called "AP (anti-parallel) state", and is defined as a data "1" state.

If a write current flowing in the direction indicated by arrow A2 in FIG. 3, i.e., from the storage layer 23 to the reference layer 25, is supplied with the magnetoresistive effect element 22, the relationship between the magnetization directions of the storage layer 23 and the reference layer 25 becomes parallel. In this parallel state, the resistance value of the magnetoresistive effect element 22 becomes smaller, and the magnetoresistive effect element 22 is set to a low-resistance state. This low-resistance state is called "P (parallel) state", and defined as a data "0" state.

The following explanation will be given in pursuant to the above-described data defining method; however, how data "1" and data "0" are defined is not limited to the above-described example. For example, the P state may be defined as data "1", and the AP state may be defined as data "0".

[1-2] Write Circuit

Next, the configuration of the write circuit of the semiconductor memory device 10 will be described. The sense amplifier and write circuit 13 of the present embodiment includes driver control circuits 13a and 13b and a write driver 13c as the write circuit.

Figure 4:
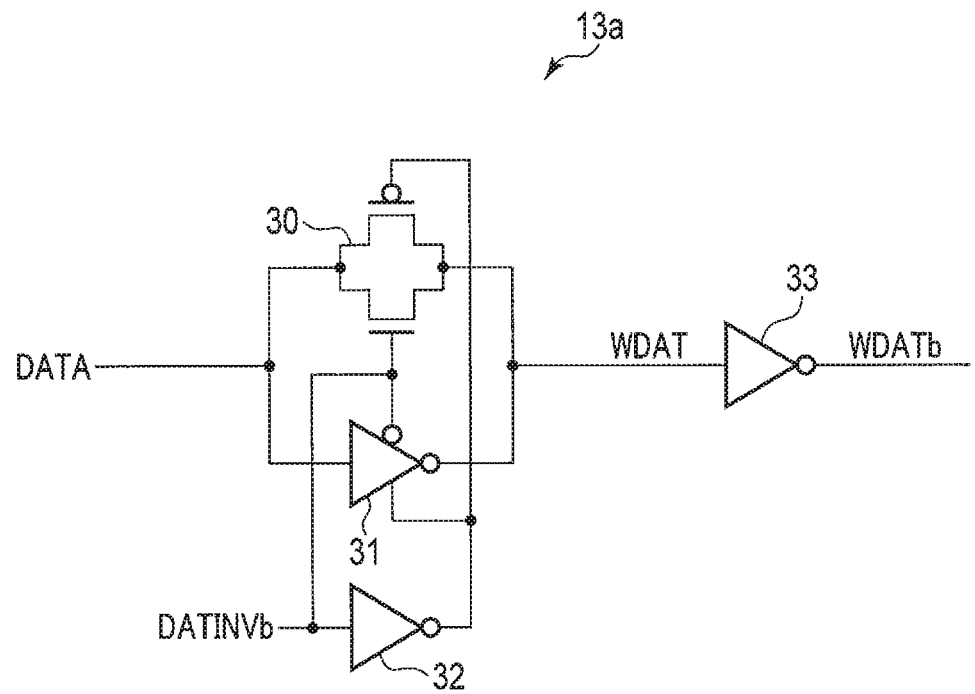
FIG. 4 is a circuit diagram of a first driver control circuit in the semiconductor memory device.
Figure 5:
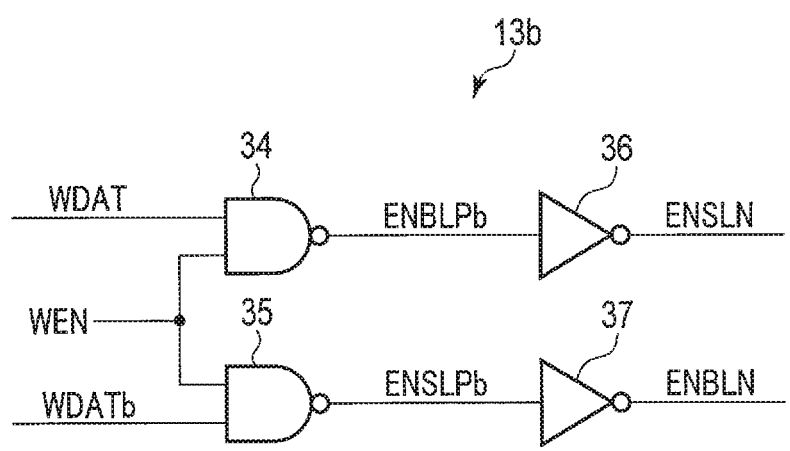
FIG. 5 is a circuit diagram of a second driver control circuit in the semiconductor memory device.

FIGS. 4 and 5 are circuit diagrams showing the configuration of the driver control circuits 13a and 13b, and FIG. 6 is a circuit diagram showing the configuration of the write driver 13c.

The configuration of the driver control circuit 13a shown in FIG. 4 will be described below. The driver control circuit 13a has a transfer transistor 30, a clocked inverter 31, and inverters 32 and 33.

A signal DATA is input to a first end of the transfer transistor 30 and to an input end of the clocked inverter 31. Signal DATINVb is input to a gate of an n-channel MOS field-effect transistor (hereinafter, an nMOS transistor) of the transfer transistor 30, and to a first control end of the clocked inverter 31. Signal DATINVb is also input to a gate of a p-channel MOS field-effect transistor (hereinafter, a pMOS transistor) of the transfer transistor 30 via the inverter 32, and to a second control end of the clocked inverter 31.

The second end of the transfer transistor 30 and the output end of the clocked inverter 32 output a signal WDAT to the inverter 33. The inverter 33 receives a signal WDAT, and outputs a signal WDATb.

Next, the configuration of the driver control circuit 13b shown in FIG. 5 will be described. The driver control circuit 13b has negative-AND circuits (hereinafter "NAND circuit") 34 and 35, and inverters 36 and 37.

A signal WDAT and a signal WDATb are supplied from the driver control circuit 13a to the driver control circuit 13b. A signal WDAT is input to a first input end of the NAND circuit 34. A signal WDATb is input to a first input end of the NAND circuit 35. A write enable signal WEN is input to a second input end of each of the NAND circuits 34 and 35. The output end of the NAND circuit 34 outputs a signal ENBLPb to the inverter 36. The output end of the NAND circuit 35 outputs a signal ENSLPb to the inverter 37. The inverter 36 receives a signal ENBLPb, and outputs a signal ENSLN. The inverter 37 receives a signal ENSLPb, and outputs a signal ENBLN.

Next, the configuration of the write driver 13c shown in FIG. 6 will be described. The write driver 13c has nMOS transistors 40, 41, 42, and 43, and pMOS transistors 44 and 45. The drains of the pMOS transistor 44 and the nMOS transistor 40 are coupled to a bit line BL. The source of the pMOS transistor 44 is supplied with a power supply voltage VDD. The source of the nMOS transistor 40 is supplied with a reference voltage VSS. The drains of the pMOS transistor 45 and the nMOS transistor 41 are coupled to a source line SL. The source of the pMOS transistor 45 is supplied with a power supply voltage VDD. The source of the nMOS transistor 41 is supplied with a reference voltage VSS.

A memory cell MC is coupled between the bit line BL and the source line SL. The drain of the nMOS transistor 42 is coupled to the bit line BL, and the source is supplied with a reference voltage VSS. The drain of the nMOS transistor 43 is coupled to the source line SL, and the source is supplied with a reference voltage VSS. The nMOS transistor 42 pre-charges the bit line BL with a reference voltage VSS. The nMOS transistor 43 pre-charges the source line SL, with a reference voltage VSS.

The pMOS transistors have the same size and the same voltage-current characteristics among others, so do the nMOS transistors, unless specified.

[2] Operation of Semiconductor Memory Device

Figure 7:
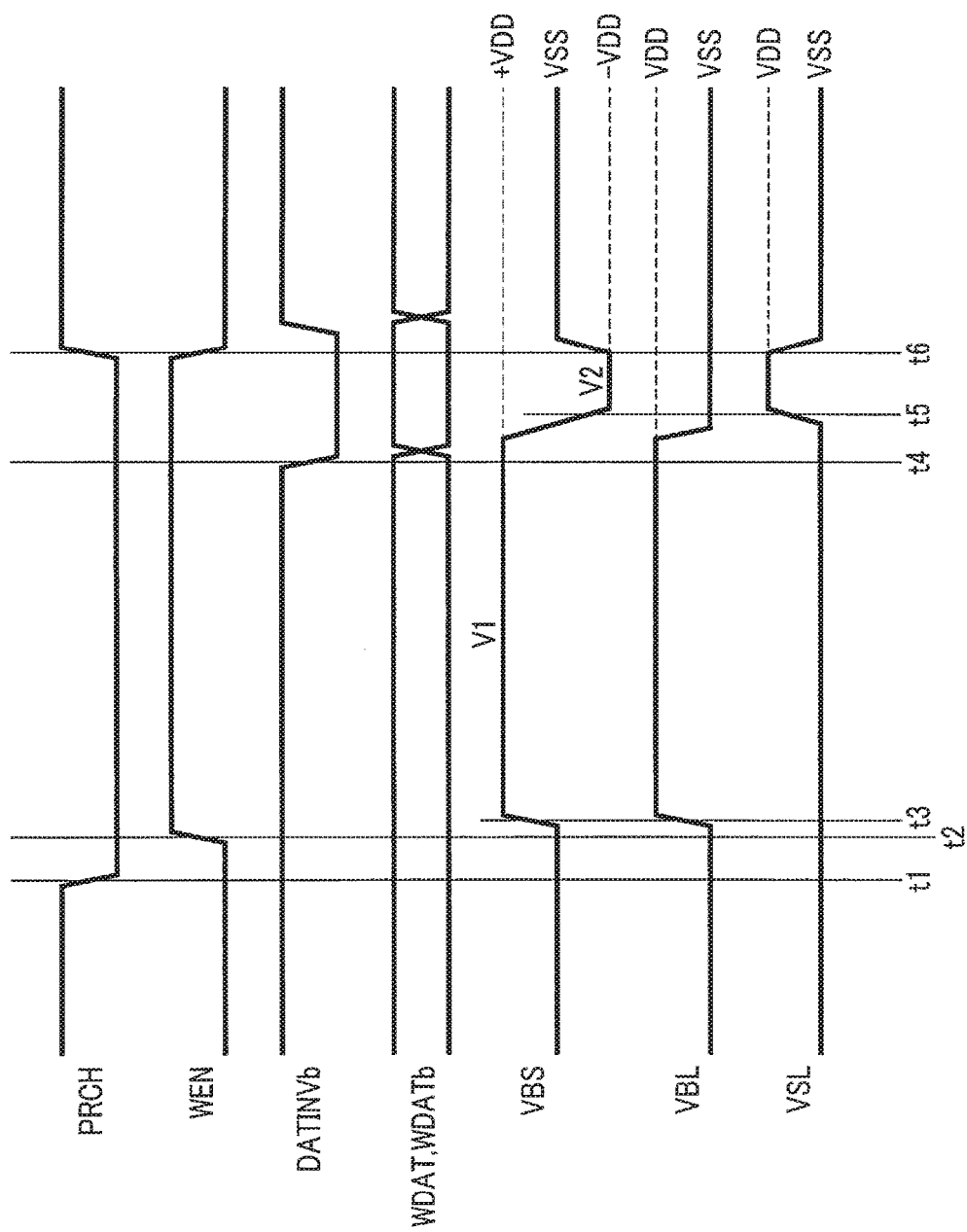
FIG. 7 is a timing chart illustrating a "1" data write operation in the semiconductor memory device.

Next, a write operation of the semiconductor memory device 10 according to the present embodiment will be described. FIG. 7 is a timing chart illustrating a write operation. FIG. 8 is a diagram showing a write current flowing in a memory cell MC during a write operation.

A signal DATA and a signal DATINVb are input to the driver control circuit 13a shown in FIG. 4. A signal DATINVb is a delayed signal of a signal DATA. When a signal DATA and a signal DATINVb are input, a signal WDAT and a signal WDATb are output from the driver control, circuit 13a. Subsequently, a signal WDAT, a signal WDATb, and a write enable signal WEN are input to the driver control circuit 13h shown in FIG. 5. A signal ENBLPb, a signal ENSLPb, a signal ENSLN, and a signal ENBLN are then output from the driver control circuit 13b.

Subsequently, a signal ENBLPb, a signal ENSLPb, a signal ENSLN, and a signal ENBLN are input to the write driver 13c shown in FIG. 6. Thus, either a power supply voltage VDD or a reference voltage VSS is applied to the bit line BL and the source line SL from the write driver 13c. As a result, a voltage VBS is applied to the memory cell MC arranged between the bit line BL and the source line SL, and a write current IW1 flows in the memory cell MC.

[2-1] Write Operation

Next, a "1" write operation that switches the memory cell MC in a low-resistance state to a high-resistance state, in other words, a case of inputting a high level (hereinafter, may be described as "H") as a signal DATA, will be described in details.

First, "H" is input as a pre-charge signal PRCH to the gates of the nMOS transistors 42 and 43 shown in FIG. 6, and the bit line BL and the source line SL are pre-charged with a voltage VSS. At time t1 thereafter, a low level (hereinafter, may be described as "1") is input as a pre-charge signal PRCH to the gates of the nMOS transistors 42 and 43, and the pre-charging of the bit line BL and the source line SL is stopped.

"H" is input as both a signal DATA and a signal DATINVb to the driver control circuit 13a shown in FIG. 4. In other words, "H" is input as a signal DATA to the first end of the transfer transistor 30 and to the input end of the clocked inverter 31. "H" is further input as a signal DATINVb to the gate of the nMOS transistor of the transfer transistor 30, the first control end of the clocked inverter 31, and the input end of the inverter 32. Thus, "H" is output as a signal WDAT from the second end of the transfer transistor 30. A signal WDAT is input to the inverter 33, and "L" is output as a signal WDATb from the inverter 33.

Next, a signal WDAT, a signal WDATb, and a write enable signal WEN are input to the driver control circuit 13b shown in FIG. 5. More specifically, "H" as a signal WDAT is input to the first input end of the NAND circuit 34, and "L" is input as a signal WDATb to the first input end of the NAND circuit 35, and "H" is input as a write enable signal WEN to the second input end of each of the NAND circuits 34 and 35. Thus, the output end of the NAND circuit 34 outputs "L" as a signal ENBLPb. The inverter 36 receives the signal ENBLPb of "L", and outputs "H" as a signal ENSLN. The output end of the NAND circuit 35 outputs "H" as a signal ENSLPb. The inverter 37 receives the signal ENSLPb of "H", and outputs "L" as a signal ENBLN.

Subsequently, "L" as a signal ENBLPb and a signal ENBLN, and "H" as a signal ENSLPb and a signal ENSLN are input to the write driver 13c shown in FIG. 6. In other words, a signal ENBLPh of "L" is input to the gate of the pMOS transistor 44, and a signal ENBLN of "L" is input to the gate of the nMOS transistor 40. As a consequence, the pMOS transistor 44 attains an ON state, and the nMOS transistor 40 attains an OFF state. Furthermore, a signal ENSLPb of "H" is input to the gate of the pMOS transistor 45, and a signal ENSLN of "H" is input to the gate of the nMOS transistor 41. As a consequence, the pMOS transistor 45 attains an OFF state, and the nMOS transistor 41 attains an ON state.

As a consequence, a power supply voltage VDD is supplied to the bit line BL from the pMOS transistor 44, and the potential of the bit line BL becomes the power supply voltage VDD. Furthermore, a reference voltage VSS is supplied to the source line SL from the nMOS transistor 41, and the potential of the source line SL becomes the reference voltage VSS. As a result, a write voltage V1 is applied to the memory cell MC coupled between the bit line BL and the source line SL, and a write current IW flows in the source line SL from the bit line BL via the memory cell MC.

After a predetermined length of time has elapsed thereafter, a signal DATINVb falls from "H" to "L". As a consequence, the transfer transistor 30 attains an OFF state, and "L" is output as a signal WDAT from the output end of the clocked inverter 31. A signal WDAT is input to the inverter 33, and "H" is output as a signal WDATb from the inverter 33.

Next, "L" as a signal WDAT is input to the first input end of the NAND circuit 34, and "H" is input as a signal WDATb to the first input end of the NAND circuit 35, and "H" is input as a write enable signal WEN to the second input end of each of the NAND circuits 34 and 35. Thus, the output end of the NAND circuit 34 outputs "H" as a signal ENBLPb. The inverter 36 receives the signal ENBLPb of "H", and outputs "L" as a signal ENSLN. The output end of the NAND circuit 35 outputs "L" as a signal ENSLPb. The inverter 37 receives the signal ENSLPb of "L", and outputs "H" as a signal ENBLN.

Subsequently, "H" as a signal ENBLPb and a signal ENBLN, and "L" as a signal ENSLPb and a signal ENSLN are input to the write driver 13c shown in FIG. 6. In other words, a signal ENBLPb of "H" is input to the gate of the pMOS transistor 44, and a signal ENBLN of "H" is input to the gate of the nMOS transistor 40. As a consequence, the pMOS transistor 44 attains an OFF state, and the nMOS transistor 40 attains an ON state. Furthermore, a signal ENSLPb of "L" is input to the gate of the pMOS transistor 45, and a signal ENSLN of "L" is input to the gate of the nMOS transistor 41. As a consequence, the pMOS transistor 45 attains an ON state, and the nMOS transistor 41 attains an OFF state.

As a consequence, a power supply voltage VDD is supplied to the source line SL from the pMOS transistor 45, and the potential of the source line SL becomes the power supply voltage VDD. Furthermore, a reference voltage VSS is supplied to the bit line BL from the nMOS transistor 40, and the potential of the bit line BL becomes the reference voltage VSS. As a result, an assist voltage V2 is applied to the memory cell MC coupled between the bit line BL and the source line SL, and a write current IW flows in the bit line BL from the source line SL via the memory cell MC.

After a predetermined length of time has elapsed thereafter, a write enable signal WEN falls from "H" to "L". If a write enable signal WEN is "L", signals ENBLPb and ENSLPb that are output from the NAND circuits 34 and 35 are always "H". At this time, signals ENSLN and ENBLN that are output from the inverters 36 and 37 are always "L". "H" as a signal ENBLPb and a signal ENSLPb, and "L" as a signal ENSLN and a signal ENBLN are input to the write driver 13c. In other words, when "H" is input as a signal ENBLPb and a signal ENSLPb to the gates of the pMOS transistors 44 and 45, the pMOS transistors 44 and 45 attain an OFF state. When "L" is input as a signal ENSLN and a signal ENBLN to the nMOS transistors 40 and 41, the nMOS transistors 40 and 41 attain an OFF state. Thus, no voltage is supplied to a bit line BL and a source line SL from the write driver 13c.

Next, a "1" write operation of the semiconductor memory device 10 according to the present embodiment will be described with reference to FIG. 7. At time t1, pre-charging of a bit line BL and a source line SL is finished. At time t1, "H" is input as a signal DATA and a signal DATINVb to the driver control circuit 13a, and "H" and "L" are respectively output as a signal WDAT and a signal WDATb from the driver control circuit 13a.

At time t2, a write enable signal WEN is asserted. In other words, a write enable signal WEN rises from "L" to "H". When a write enable signal WEN is asserted, the voltage VBL to be applied to the bit line BL becomes "H", and the voltage VSL to be applied to the source line SL becomes "L". Thus, at time t3, the voltage VBS between a bit line BL and a source line SL applied to the memory cell MC becomes the voltage VDD.

At time t4 thereafter, the signal DATINVb falls from "H" to "L". As a result, the voltage of a signal WDAT and the voltage of a signal WDATb are reversed. In other words, a signal WDAT of "H" falls to "L", and a signal WDATb of "L" rises to "H". This voltage reversal of the signal WDAT and the signal WDATb causes reversal of the voltage VBL and the voltage VSL applied to the bit line BL and the source line SL; consequently, the voltage VBL becomes "L" and the voltage VSL becomes "H". Thus, at time t5, the voltage VBS between the bit line BL and the source line SL applied to the memory cell MC becomes the voltage −VDD.

Subsequently, at time t6, a write enable signal WEN is negated. In other words, a write enable signal WEN falls from "H" to "L". When a write enable signal WEN is negated, the pMOS transistors 44 and 45 and the nMOS transistors 40 and 41 attain an OFF state, and a voltage to be applied to the bit line BL and the source line SL are interrupted. Immediately after time t6, a pre-charge signal PRCH is asserted. In other words, a pre-charge signal PRCH rises from "L" to "H". When a pre-charge signal PRCH is asserted, the bit line BL and the source line SL are pre-charged with a voltage VSS, and the voltage VBL and the voltage VSL thus become the voltage VSS. As a result, the voltage VBS between the bit line BL and the source line SL applied to the memory cell MC becomes 0 V.

Thus, at the time of a "1" write operation, a write voltage (first voltage) V1 is applied to the memory cell MC, and an assist voltage (second voltage) V2, which has reversed polarity of the write voltage V1, is applied.

FIG. 8 shows a write current IW1 in a case where the voltage VBS shown in FIG. 7 is applied to the memory cell MC. The write current IW1 has a current value Ia when the memory cell is in a low-resistance state during a period in which a write voltage V1 is applied, and has a current value Ib when the memory cell MC is switched from a low-resistance state to a high-resistance state. Furthermore, the write current IW1 becomes a value −Ic during a period in which an assist voltage V2 is applied.

FIG. 9 shows a write current IW2 in a case where a "1" write operation is performed on a memory cell MC in a high-resistance state ("1" state). The write current IW2 becomes a current value Ib because the memory cell MC is maintained in a high-resistance state during a period of applying a write voltage V1. Furthermore, the write current IW2 becomes a current value −Ic during a period of applying an assist voltage V2.

Figure 10:
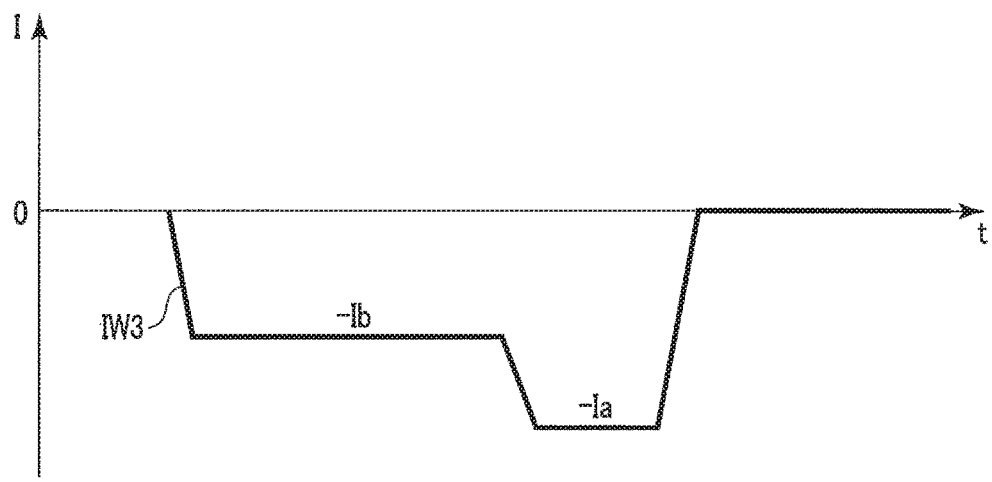
FIGS. 10 and 11 are diagrams showing a write current flowing in a memory cell during a "0" data write operation in the semiconductor memory device.

FIG. 10 shows a write current IW3 in a case where a "0" write operation is performed to switch a memory cell MC in a high-resistance state ("1" state) to a low-resistance state ("0" state). In a "0" write operation, a voltage VDD, i.e., voltage −V1, is applied from the source line SL to the bit line BL; thus the write current IW3 becomes a current flowing in a reversed direction of the current IW1 and IW2. During a period of applying the write voltage −V1, the write current IW3 becomes a current value −Ib if the memory cell MC is in a high-resistance state, and becomes a current value −Ia if the high-resistance state is changed to a low-resistance state. An assist voltage having reversed polarity of a write voltage is not applied in the present case.

Figure 11:
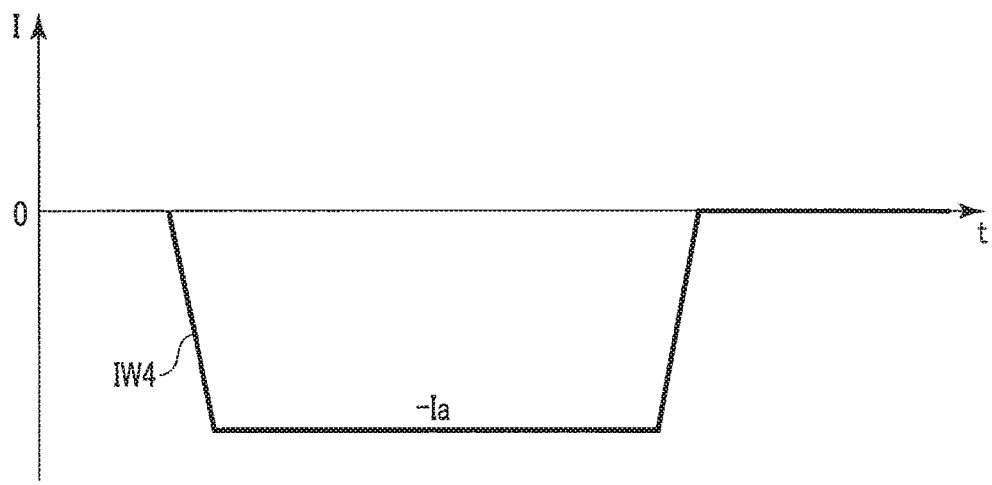

Furthermore, FIG. 11 shows a write current IW4 in a case where a "0" write operation is performed on a memory cell MC in a low-resistance state. The write current IW4 becomes a current value −Ia during a period of applying the write voltage −V1 because the memory cell MC is maintained in a low-resistance state. An assist voltage having reversed polarity of a write voltage is not applied also in the present case.

In a "0" write operation where a high-resistance state (or a low-resistance state) is changed to a low-resistance state, an assist voltage having reversed polarity of a write voltage is not applied. Thus, a reversed current of the current values −Ib and −Ia does not flow in a "0" write operation.

[2-2] First Modification of Write Operation

In the embodiment shown in FIGS. 7 and 8, after a write voltage V1 applied, an assist voltage V2 is applied concurrently with the rise of the write voltage V1; however, in the first modification, a period during which a voltage is 0 V, in other words, no voltage is applied, is provided after a write voltage V1 is applied, and an assist voltage V2 is applied thereafter.

Figure 13:
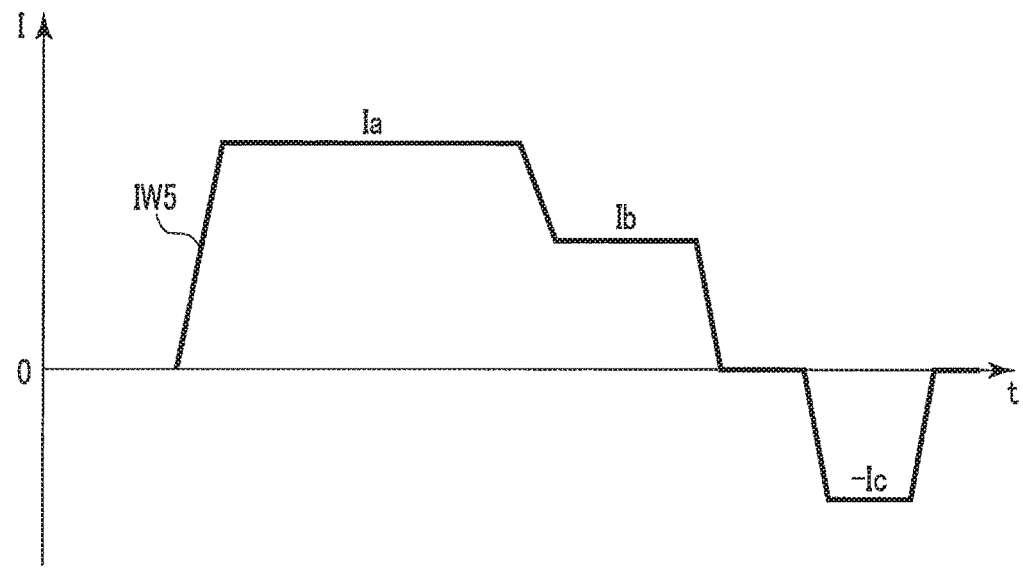
FIG. 13 is a diagram showing a write current flowing in a memory cell during the "1" data write operation.

FIG. 12 is a timing chart illustrating a write operation of the first modification. FIG. 13 is a diagram showing a write current flowing in a memory cell MC during a write operation.

At time t11, pre-charging of a bit line BL and a source line SL is finished. At time t11, "H" is input as a signal DATA and a signal DATINVb to the driver control circuit 13a, and "H" and "L" are respectively output as a signal WDAT and a signal WDATb from the driver control circuit 13a.

At time t12, a write enable signal WEN is asserted. When a write enable signal WEN is asserted, the voltage VBL to be applied to the bit line BL becomes "H", and the voltage VSL to be applied to the source line SL becomes "L" Thus, at time t13, the voltage VBS between the bit line BL and the source line SL applied to the memory cell MC becomes the voltage VDD.

Thereafter, at time t14, a write enable signal WEN is negated. When a write enable signal WEN is negated, the pMOS transistors 44 and 45 and the nMOS transistors 40 and 41 attain an OFF state, and a voltage to be applied to the bit line BL and the source line SL are interrupted. Immediately after time t14, a pre-charge signal PRCH is asserted. When a pre-charge signal PRCH is asserted, the voltage VBL and the voltage VSL thus become the voltage VSS. As a result, the voltage VBS between the bit line BL and the source line SL applied to the memory cell MC becomes 0 V.

At time t15 thereafter, the signal DATINVb falls from "H" to "L". As a result, the voltage of a signal WDAT and a signal WDATb is reversed. Furthermore, at time t16, a write enable signal WEN is asserted. When a write enable signal WEN is asserted, the voltage VBL is maintained at the voltage VSS, and the voltage VSL becomes the voltage VDD. Thus, at time t17, the voltage VBS between a bit line BL and a source line SL becomes the voltage −VDD.

Subsequently, at time t18, a write enable signal WEN is negated. When a write enable signal WEN is negated, the pMOS transistors 44 and 45 and the nMOS transistors 40 and 41 attain an OFF state, and a voltage to be applied to the bit line BL and the source line SL are interrupted. Immediately after time t18, a pre-charge signal PRCH is asserted. When a pre-charge signal PRCH is asserted, the bit line BL and the source line SL are pre-charged with the voltage VSS, and the voltage VBL and the voltage VSL thus become the voltage VSS. As a result, the voltage VBS between a bit line BL and a source line SL becomes 0 V.

Thus, at the time of a "1" write operation, a write voltage (first voltage) V1 is applied to the memory cell MC, and a voltage applied to the memory cell MC then becomes 0 V, and an assist voltage (second voltage) V2, which has reversed polarity of the write voltage V1, is applied. Herein, a period during which the voltage is 0 V is provided between the period of applying the write voltage V1 and the period of applying the assist voltage V2; however, a period during which an intermediate voltage between the write voltage V1 and the assist voltage V2 is applied may be provided instead of the period during which the voltage is 0 V.

FIG. 13 shows a write current IW5 in a case where the voltage VBS shown in FIG. 12 is applied to a memory cell MC. The write current IW5 has a current value Ia when the memory cell MC is in a low-resistance state during a period in which a write voltage V1 is applied, and has a current value Ib when a low-resistance state is changed to a high-resistance state. Furthermore, the write current IW5 becomes zero during a period in which the voltage is 0 V, and then becomes a current value −Ic during a period of applying a write voltage V2.

[2-3] Second Modification of Write Operation

In the embodiment shown in FIGS. 7, 8, 12 and 13, an assist voltage V2 is applied after a write voltage V1 is applied; however, in the second modification, an assist voltage V2 is applied immediately before a write voltage V1 is applied.

Figure 14:
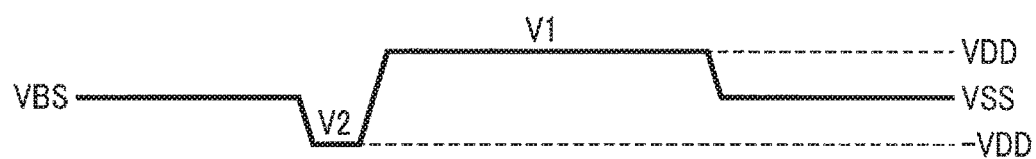
FIG. 14 is a diagram showing a voltage applied to a memory cell during a "1" data write operation in a second modification.

FIG. 14 is a diagram showing the voltage VBS applied to a memory cell MC during a write operation in the second modification. As shown in the drawing, an assist voltage V2 having reversed polarity of a write voltage V1 is applied immediately before applying the write voltage V1, and the write voltage V1 is applied immediately thereafter.

[2-4] Third Modification of Write Operation

In the third modification, the assist voltage V2 is applied before applying the write voltage V1, similarly to the second modification, but a period of applying a voltage of 0 V is provided during the period of applying the assist voltage V2 and the period of applying the write voltage V1.

Figure 15:
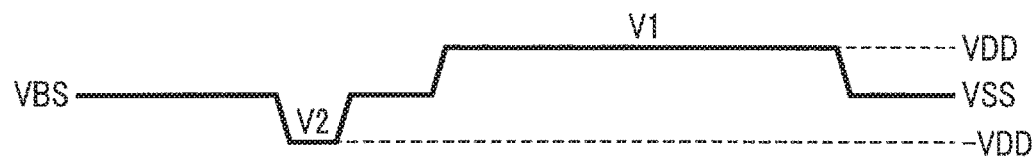
FIG. 15 is a diagram showing a voltage applied to a memory cell during a "1" data write operation in a third modification.

FIG. 15 is a diagram showing the voltage VBS applied to a memory cell MC during a write operation in the third modification. As shown in the drawing, an assist voltage V2 is first applied, no voltage (0 V) is then applied, and a write voltage V1 is applied thereafter. Herein, a period during which the voltage is 0 V is provided between the period of applying the assist voltage V2 and the period of applying the write voltage V1; however, a period during which an intermediate voltage between the assist voltage V2 and the write voltage V1 is applied may be provided instead of the period during which the voltage is 0 V.

[3] Advantageous Effects of Present Embodiment

According to the present embodiment, in a write operation in which a memory cell MC is switched from a low-resistance state (or a high-resistance state) to a high-resistance state, a write voltage V1 is applied to the memory cell, and an assist voltage V2 having reversed polarity of the write voltage V1 is applied thereafter. Or, an assist voltage V2 having reversed polarity of a write voltage V1 is applied before applying the write voltage V1 to the memory cell MC, and the write voltage V1 is applied thereafter. Thus, the magnetization reversal occurring in the reference layer of the memory cell MC is immediately restored to the magnetization before the reversal. As a result, it is possible to shorten a time until a write or read operation is operated next.

Furthermore, the magnetoresistive effect element of the memory cell MC makes an antiferromagnetic coupling between the reference layer 25 and the shift adjustment layer 27. In other words, the reference layer 25, the coupling layer 26, and the shift adjustment layer 27 constitute an SAF structure. Such a configuration excels at maintaining stored data; on the other hand, the magnetization direction of the reference layer 25 may be reversed at the time of a "1" write operation in which a low-resistance state is changed to a high-resistance state. For this reason, if the write operation according to the present embodiment is applied to a memory cell MC including a magnetoresistive effect element having an SAF structure, it is possible to immediately restore the magnetization reversal occurring in a reference layer. As a result, it is possible to shorten a time until when a write or read operation can be performed after this write operation. Furthermore, since it is possible to prevent a write or read operation before restoring the magnetization reversal occurring in the reference layer, it is possible to decrease the occurrence of write errors and read errors due to the magnetization reversal.

As described above, the present embodiment can provide a semiconductor memory device that can shorten a time until when a next write or read operation can be performed after a write operation.

[4] Other Notes

A perpendicular magnetization type magnetoresistive effect element is explained. In the above-described embodiments; however, the embodiments are not limited thereto. The embodiments are applicable to an in-plane magnetization type magnetoresistive effect element, for example.

In addition, the embodiments are applicable to a memory cell including a resistive memory element, such as a magnetoresistive effect element (MTJ element) for storing data by resistance change due to current or voltage application, or to a semiconductor memory device including such a memory cell.

The embodiments are further applicable to a memory cell including a memory element which is capable of reading stored data by converting a resistance difference due to a resistance change into a current difference or a voltage difference, or to a semiconductor memory device including such a memory cell.

In the above-described embodiment, a case where an SAF structure is applied to a reference layer; however, the embodiments are not limited thereto. In other words, even when an SAF structure is applied to a storage layer, a similar effect can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
a resistance change element having a first magnetic layer, a second magnetic layer, a third magnetic layer, a non-magnetic layer disposed between the first magnetic layer and the second magnetic layer, and a metal layer disposed between the second magnetic layer and the third magnetic layer; and
a write circuit configured to apply a voltage to the resistance change element,
wherein:
an antiferromagnetic coupling is made between the second magnetic layer and the third magnetic layer, and the second magnetic layer, the metal layer, and the third magnetic layer comprise a synthetic antiferromagnetic (SAF) structure, and
the write circuit applies a first voltage and a second voltage having reversed polarity of the first voltage to the resistance change element in a first write operation in which the resistance change element is changed from a first resistance value to a second resistance value which is greater than the first resistance value.

2. The semiconductor memory device according to claim 1, wherein reversal of a magnetization direction occurring in the second magnetic layer is restored by applying the second voltage to the resistance change element.

3. The semiconductor memory device according to claim 1, wherein the write circuit applies the second voltage after applying the first voltage.

4. The semiconductor memory device according to claim 1, wherein the write circuit applies the second voltage before the first voltage is applied.

5. The semiconductor memory device according to claim 1, wherein a period of applying the second voltage is shorter than a period of applying the first voltage.

6. The semiconductor memory device according to claim 1, wherein the second voltage has a value same as the first voltage.

7. The semiconductor memory device according to claim 1, wherein the second voltage is lower than the first voltage.

8. The semiconductor memory device according to claim 1, wherein a third voltage which is between the first voltage and the second voltage is applied in a period between a period of applying the first voltage and a period of applying the second voltage.

9. The semiconductor memory device according to claim 8, wherein the third voltage is 0 V.

10. The semiconductor memory device according to claim 1, wherein the write circuit applies the first voltage to the resistance change element but does not apply the second voltage in a second write operation in which the resistance change element is changed from the second resistance value to the first resistance value.

11. The semiconductor memory device according to claim 1, wherein the first magnetic layer includes at least one of Fe, B, and Co, the non-magnetic layer includes MgO, and the second magnetic layer includes at least one of Co, Pt, Pd, and Ni.

12. The semiconductor memory device according to claim 1, wherein the metal layer includes at least one of Ru, Rh, and Os, and the third magnetic layer includes at least one of Co, Pt, Pd, and Ni.

13. A semiconductor memory device comprising:
a resistance change element having a first magnetic layer, a second magnetic layer, a third magnetic layer, a non-magnetic layer disposed between the first magnetic layer and the second magnetic layer, and a metal layer disposed between the second magnetic layer and the third magnetic layer; and
a write circuit configured to supply a current to the resistance change element,
wherein:
an antiferromagnetic coupling is made between the second magnetic layer and the third magnetic layer, and the second magnetic layer, the metal layer, and the third magnetic layer comprise a synthetic antiferromagnetic (SAF) structure, the write circuit supplies a first current and a second current which flows in a reversed direction of the first current to the resistance change element in a first write operation in which the resistance change element is changed from a first resistance value to a second resistance value which is greater than the first resistance value.

14. The semiconductor memory device according to claim 13, wherein reversal of a magnetization direction occurring in the second magnetic layer is restored by supplying the second current to the resistance change element.

15. The semiconductor memory device according to claim 13, wherein the write circuit supplies the second current after the first current is supplied.

16. The semiconductor memory device according to claim 13, wherein the write circuit supplies the second current before supplying the first current.

17. The semiconductor memory device according to claim 13, wherein a period of supplying the second current is shorter than a period of supplying the first current.

18. The semiconductor memory device according to claim 13, wherein the write circuit supplies the first current to the resistance change element but does not supply the second current in a second write operation in which the resistance change element is changed from the second resistance value to the first resistance value.

19. The semiconductor memory device according to claim 13, wherein the first magnetic layer includes at least one of Fe, B, and Co, the non-magnetic layer includes MgO, and the second magnetic layer includes at least one of Co, Pt, Pd, and Ni.

20. The semiconductor memory device according to claim 13, wherein the metal layer includes at least one of Ru, Rh, and Os, and the third magnetic layer includes at least one of Co, Pt, Pd, and Ni.

* * * * *